(12) United States Patent
Nakamura

(10) Patent No.: US 7,446,020 B2
(45) Date of Patent: Nov. 4, 2008

(54) WAFER DIVIDING METHOD AND DIVIDING APPARATUS

(75) Inventor: Masaru Nakamura, Tokyo (JP)

(73) Assignee: Disco Corporation, Tokyo (JP)

( * ) Notice: Subject to any disclaimer, the term of this patent is extended or adjusted under 35 U.S.C. 154(b) by 149 days.

(21) Appl. No.: 11/236,631

(22) Filed: Sep. 28, 2005

(65) Prior Publication Data
US 2006/0073677 A1    Apr. 6, 2006

(30) Foreign Application Priority Data
Oct. 4, 2004    (JP)    ............................ 2004-291083

(51) Int. Cl.
*H01L 21/46*    (2006.01)
(52) U.S. Cl. .................. 438/460; 257/E21.499; 257/E21.215; 257/E21.237; 438/457; 438/459; 438/462; 438/478; 438/691
(58) Field of Classification Search ................. 438/460, 438/457, 459, 462, 691; 257/E21.499, E21.215, 257/E21.237
See application file for complete search history.

(56) References Cited

U.S. PATENT DOCUMENTS 7,021,635 B2 *    4/2006    Sheydayi ........................ 279/3

| | | | |
|---|---|---|---|
| 2003/0077879 A1 * | 4/2003 | Ohno et al. | 438/460 |
| 2004/0241962 A1 * | 12/2004 | Nagai | 438/460 |
| 2005/0090077 A1 | 4/2005 | Nagai et al. | |
| 2007/0029684 A1 * | 2/2007 | Arai et al. | 257/E21.237 |
| 2007/0232030 A1 * | 10/2007 | Kumagai | 438/478 |

FOREIGN PATENT DOCUMENTS

| | | |
|---|---|---|
| JP | 2002192370 | 10/2002 |
| JP | 3408805 | 3/2003 |
| JP | 2005-129607 | 5/2005 |

* cited by examiner

*Primary Examiner*—Michael Lebentritt
(74) *Attorney, Agent, or Firm*—Smith, Gambrell & Russell, LLP

(57) ABSTRACT

A method of dividing a wafer whose strength is reduced along a plurality of dividing lines formed in a lattice pattern on the front surface, along the dividing lines, comprising the steps of:

a tape affixing step for affixing a protective tape to one side of the wafer;

a wafer holding step for holding the wafer affixed to the protective tape on both sides of each dividing line through the protective tape; and a breaking step for dividing the wafer along each dividing line by sucking, along each dividing line, the wafer held through the protective tape.

6 Claims, 13 Drawing Sheets

(a)

(b)

(a)

(b)

(a)

(b)

WAFER DIVIDING METHOD AND DIVIDING APPARATUS

FIELD OF THE INVENTION

The present invention relates to a method of dividing a wafer having dividing lines formed in a lattice pattern on the front surface, along the dividing lines; and to a dividing apparatus.

DESCRIPTION OF THE PRIOR ART

In the production process of a semiconductor device, a plurality of areas are sectioned by dividing lines called "streets" arranged in a lattice pattern on the front surface of a substantially disk-like semiconductor wafer, and a circuit such as IC or LSI is formed in each of the sectioned areas. Individual semiconductor chips are manufactured by cutting this semiconductor wafer along the dividing lines to divide it into the areas having a circuit formed thereon. An optical device wafer comprising gallium nitride-based compound semiconductors laminated on the front surface of a sapphire substrate is also cut along predetermined dividing lines to be divided into individual optical devices such as light-emitting diodes or laser diodes, which are widely used in electric equipment.

Cutting along the dividing lines of the above semiconductor wafer or optical device wafer is generally carried out by using a cutting machine called "dicer". This cutting machine comprises a chuck table for holding a workpiece such as a semiconductor wafer or optical device wafer, a cutting means for cutting the workpiece held on the chuck table, and a cutting-feed means for moving the chuck table and the cutting means relative to each other. The cutting means comprises a rotary spindle, a cutting blade mounted on the spindle and a drive mechanism for rotary-driving the rotary spindle. The cutting blade comprises a disk-like base and an annular cutting edge that is mounted on the side wall peripheral portion of the base and formed as thick as about 20 μm fixing diamond abrasive grains having a diameter of about 3 μm to the base by electroforming.

Since a sapphire substrate, silicon carbide substrate, etc. have high Mohs hardness, cutting with the above cutting blade is not always easy. Further, as the cutting blade has a thickness of about 20 μm, the dividing lines for sectioning devices must have a width of about 50 μm. Therefore, in the case of a device measuring 300 μm×300 μm, the area ratio of the streets to the wafer becomes 14%, whereby there is a problem with reduction of productivity.

As a means of dividing a plate-like workpiece such as a semiconductor wafer, a laser processing method for applying a pulse laser beam capable of passing through the workpiece with its focusing point set to the inside of the area to be divided is also attempted nowadays and disclosed by Japanese Patent No. 3408805. In the dividing method making use of this laser processing technique, the workpiece is divided by applying a pulse laser beam of an infrared range capable of passing through the workpiece, with its focusing point set to the inside, from one side of the workpiece to continuously form a deteriorated layer in the inside of the workpiece along the dividing lines and exerting external force along the dividing lines whose strength has been reduced by the formation of the deteriorated layers.

To divide a wafer having deteriorated layers formed continuously along the dividing lines into individual chips by exerting external force along the dividing lines of the wafer, the applicant of this application has proposed technology for dividing a wafer into individual chips by expanding a protective tape affixed to the wafer to give tensile force to the wafer as Japanese patent application No. 2003-361471.

In the method of giving tensile force to the wafer by expanding the protective tape mounted on the wafer, when the protective tape affixed to the wafer is expanded, tensile force acts on the wafer radially. Therefore, tensile force works in a random direction to the dividing lines formed in a lattice pattern, whereby the wafer is divided irregularly and an undivided area remains. When a wafer having a test metal pattern called "test element group (TEG)" for testing the function of each circuit on the dividing lines is divided along the dividing lines by expanding the protective tape as described above, irregular force acts on the above metal pattern, whereby problems occur in that the metal pattern is broken jaggedly, causes contamination and reduces the quality of each device.

SUMMARY OF THE INVENTION

It is an object of the present invention to provide a wafer dividing method and a dividing machine capable of dividing, along the dividing lines, a wafer whose strength has been reduced along the dividing lines, accurately and surely.

According to a first aspect of the present invention, there is provided a method of dividing a wafer whose strength is reduced along a plurality of dividing lines formed in a lattice pattern on the front surface, along the dividing lines, comprising the steps of:

a tape affixing step for affixing a protective tape to one side of the wafer;

a wafer holding step for holding the wafer affixed to the protective tape on both sides of each dividing line through the protective tape; and a breaking step for dividing the wafer along each dividing line by sucking, along each dividing line, the wafer held through the protective tape.

Preferably, a thin film is formed on the dividing lines of the wafer and a step of expanding the protective tape to break and divide the thin film formed on the dividing lines of the wafer is carried out after the breaking step.

According to a second aspect of the present invention, there is provided a wafer dividing apparatus for dividing a wafer whose strength is reduced along a plurality of dividing lines formed in a lattice pattern on the front surface, along the dividing lines, comprising:

a tape holding means for holding a protective tape affixed to one side of the wafer; and a suction-force providing means for holding the wafer held on the tape holding means through the protective tape on both sides of each dividing line through the protective tape and sucking the wafer through the protective tape along each dividing line.

The suction-force providing means comprises a wafer holding member having a suction groove open to the top surface and holding portions formed on both sides of the suction groove and a suction means which communicates with the suction groove of the wafer holding member. The wafer dividing apparatus has a positioning means for positioning the wafer holding member and the tape holding means at predetermined locations. The protective tape is mounted on an annular frame, and the tape holding means has a frame holding means for supporting the annular frame.

In the present invention, since the wafer held on both sides of each dividing line through the protective tape is sucked along each dividing line to be divided along the dividing line, the wafer can be divided along the dividing lines whose strength has been reduced, accurately and surely.

DETAILED DESCRIPTION OF THE PREFERRED EMBODIMENTS

Preferred embodiments of the wafer dividing method and the dividing machine the present invention will be described hereinunder with reference to the accompanying drawings.

Figure 1:
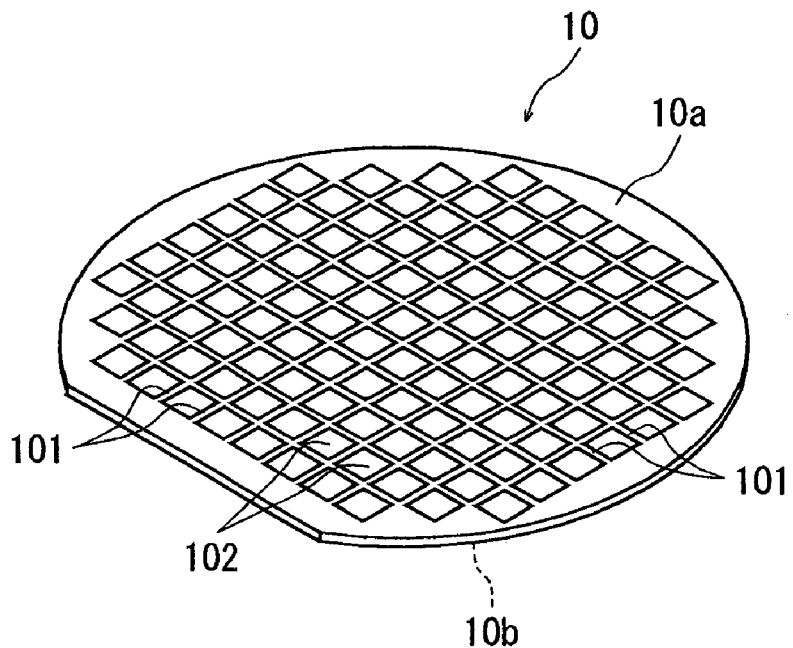
FIG. 1 is a perspective view of a semiconductor wafer to be divided by the wafer dividing method of the present invention.

FIG. 1 is a perspective view of a semiconductor wafer as a wafer to be processed according to the present invention. The semiconductor wafer 10 shown in FIG. 1 is a silicon wafer having a thickness of, for example, 100 μm, and a plurality of dividing lines 101 are formed in a lattice pattern on the front surface 10a thereof. Circuits 102 as function elements are formed in a plurality of areas sectioned by the plurality of dividing lines 101 on the front surface 10a of the semiconductor wafer 10. The method of dividing this semiconductor wafer 10 into individual semiconductor chips will be described hereinunder.

To divide the semiconductor wafer 10 into individual semiconductor chips, a laser processing step for forming a deteriorated layer in the inside of the semiconductor wafer 10 along the dividing lines 101 by applying a pulse laser beam capable of passing through the semiconductor wafer 10 along the dividing lines 101 is carried out to reduce the strength of the semiconductor wafer 10 along the dividing lines 101. This laser processing step is carried out by using a laser beam processing machine 2 shown in FIGS. 2 to 4. The laser beam processing machine 2 shown in FIGS. 2 to 4 comprises a chuck table 21 for holding a workpiece, a laser beam application means 22 for applying a laser beam to the workpiece held on the chuck table 21, and an image pick-up means 23 for picking up an image of the workpiece held on the chuck table 21. The chuck table 21 is so constituted as to suction-hold the workpiece and is designed to be moved in a processing-feed direction indicated by an arrow X and an indexing-feed direction indicated by an arrow Y in FIG. 2 by a moving mechanism that is not shown.

Figure 3:
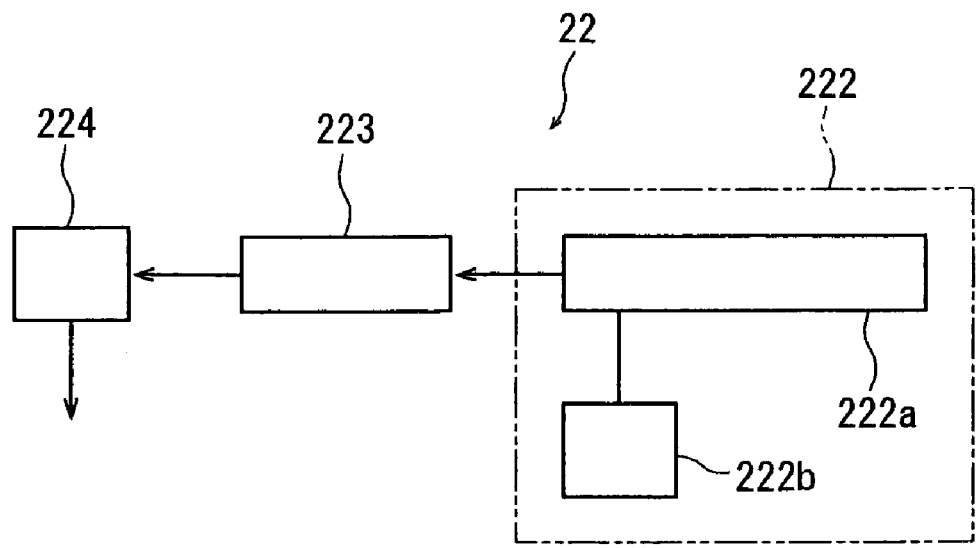
FIG. 3 is a block diagram schematically showing the constitution of a laser beam application means provided in the laser beam processing machine shown in FIG. 2.
Figure 4:
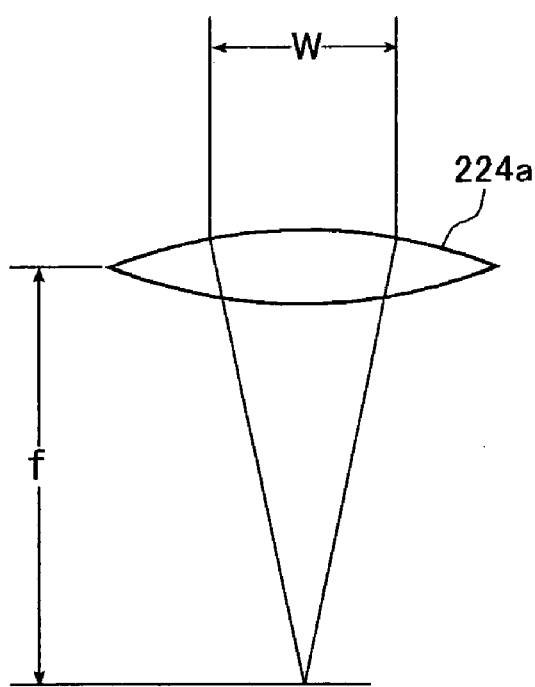
FIG. 4 is a schematic diagram explaining the focusing spot diameter of a pulse laser beam.

The above laser beam application means 22 has a cylindrical casing 221 arranged substantially horizontally. In the casing 221, as shown in FIG. 3, there are installed a pulse laser beam oscillation means 222 and a transmission optical system 223. The pulse laser beam oscillation means 222 comprises a pulse laser beam oscillator 222a composed of a YAG laser oscillator or YVO4 laser oscillator and a repetition frequency setting means 222b connected to the pulse laser beam oscillator 222a. The transmission optical system 223 comprises suitable optical elements such as a beam splitter, etc. A condenser 224 housing condensing lenses (not shown) constituted by a set of condenser lenses that may be formation known per se is attached to the end of the above casing 221. A laser beam oscillated from the above pulse laser beam oscillation means 222 reaches the condenser 224 through the transmission optical system 223 and is applied from the condenser 224 to the workpiece held on the above chuck table 21 at a predetermined focusing spot diameter D. This focusing spot diameter D is defined by the expression $D\ (\mu m) = 4 \times \lambda \times f / (\pi \times W)$ (wherein $\lambda$ is the wavelength (μm) of the pulse laser beam, W is the diameter (mm) of the pulse laser beam applied to an objective lens 224a, and f is the focusing distance (mm) of the objective lens 224a) when the pulse laser beam showing a Gaussian distribution is applied through the objective lens 224a of the condenser 224 as shown in FIG. 4.

The image pick-up means 23 attached to the end of the casing 221 constituting the above laser beam application means 22 comprises an infrared illuminating means for applying infrared radiation to the workpiece, an optical system for capturing infrared radiation applied by the infrared illuminating means, and an image pick-up device (infrared CCD) for outputting an electric signal corresponding to infrared radiation captured by the optical system, in addition to an ordinary image pick-up device (CCD) for picking up an image with visible radiation in the illustrated embodiment. An image signal is transmitted to a control means that is not shown.

The laser processing step which is carried out by using the above laser beam processing machine 2 will be described with reference to FIG. 2, FIGS. 5(a) and 5(b), and FIGS. 6(a) and 6(b).

Figure 2:
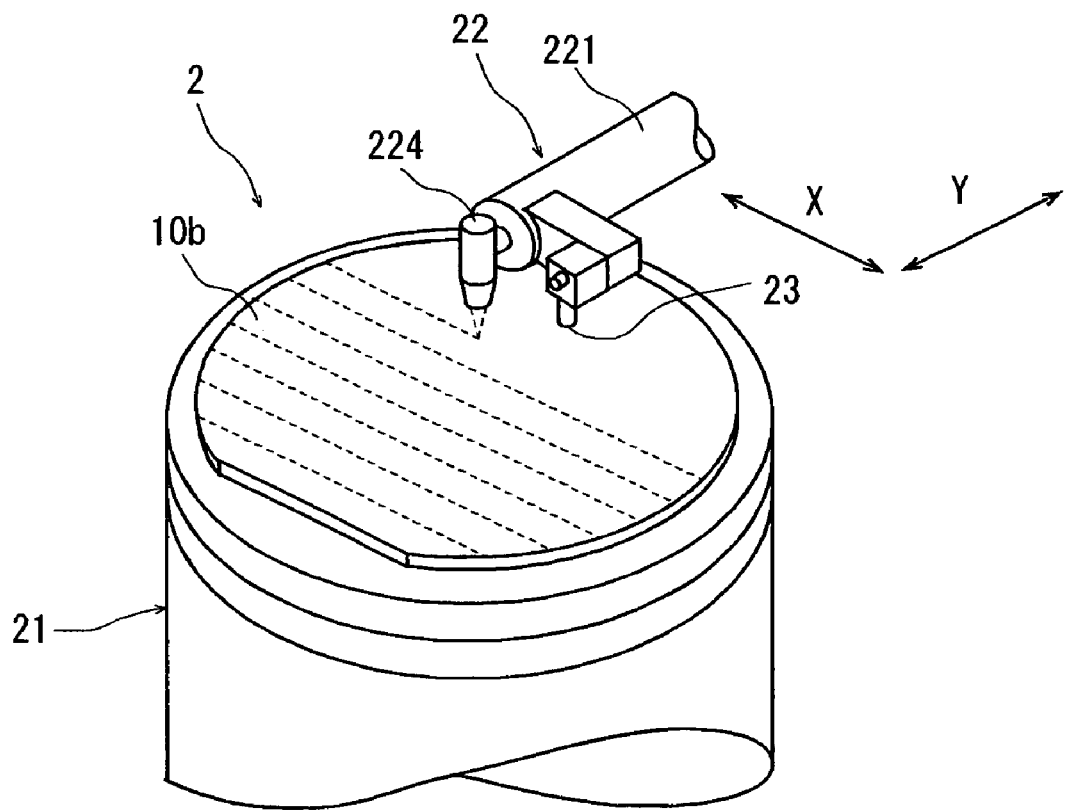
FIG. 2 is a perspective view of the principal section of a laser beam processing machine for carrying out the laser processing step in the wafer dividing method of the present invention.

In this laser processing step, the semiconductor wafer 10 is first placed on the chuck table 21 of the laser beam processing machine 2 shown in FIG. 2 in such a manner that the back surface 10b faces up and suction-held on the chuck table 21. The chuck table 21 suction-holding the semiconductor wafer 10 is positioned right below the image pick-up means 23 by a moving mechanism that is not shown.

After the chuck table 21 is positioned right below the image pick-up means 23, alignment work for detecting the area to be processed of the semiconductor wafer 10 is carried out by using the image pick-up means 23 and the control means that is not shown. That is, the image pick-up means 23 and the control means (not shown) carry out image processing such as pattern matching, etc. to align a dividing line 101 formed in a predetermined direction of the semiconductor wafer 10 with the condenser 224 of the laser beam application means 22 for applying a laser beam along the dividing line 101, thereby performing the alignment of a laser beam application position. The alignment of the laser beam application position is also carried out on dividing lines 101 formed on the semiconductor wafer 10 in a direction perpendicular to the predetermined direction. Although the front surface 10a, on which the dividing lines 101 have been formed, of the semiconductor wafer 10 faces down at this point, an image of the dividing line 101 can be taken through the back surface 10b as the image pick-up means 23 comprises infrared illuminating means, an optical system for capturing infrared radiation and an image pick-up device (infrared CCD) for outputting an electric signal corresponding to the infrared radiation as described above.

Figure 5:
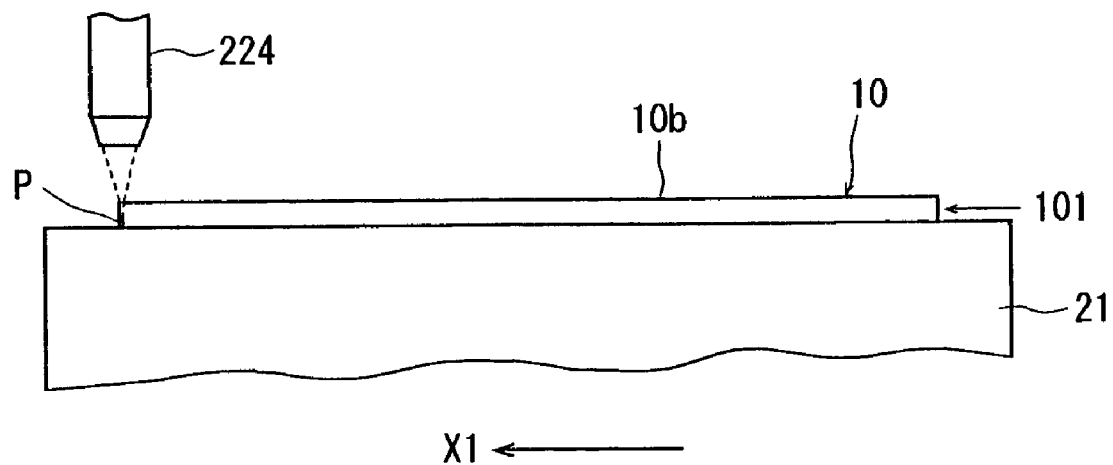
FIGS. 5(a) and 5(b) are diagrams showing an embodiment of the laser processing step in the wafer dividing method of the present invention.
Figure 5:
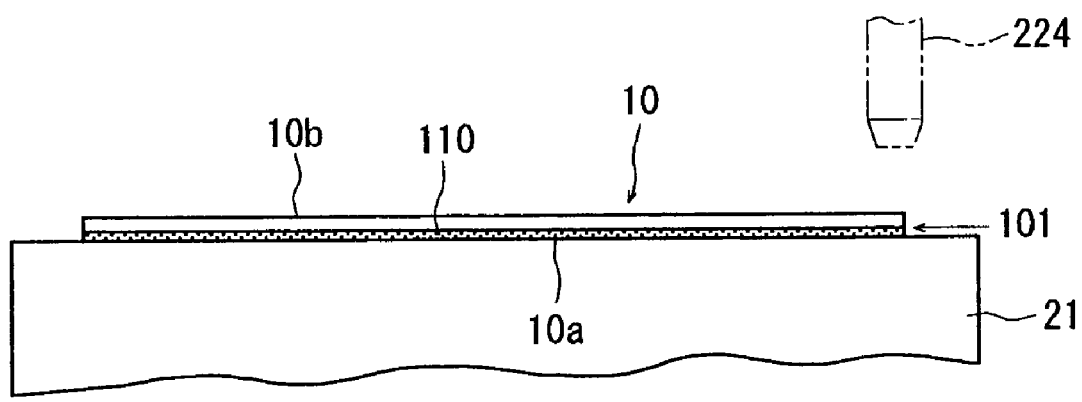

After the dividing line 101 formed on the semiconductor wafer 10 held on the chuck table 21 is detected and the alignment of the laser beam application position is carried out as described above, the chuck table 21 is moved to a laser beam application area where the condenser 224 of the laser beam application means 22 for applying a laser beam is located, as shown in FIG. 5(a), to bring one end (left end in FIG. 5(a)) of the predetermined dividing line 101 to a position right below the condenser 224 of the laser beam application 50 means 22. The chuck table 21, that is, the semiconductor wafer 10 is then moved in the direction indicated by the arrow X1 in FIG. 5(a) at a predetermined processing-feed rate while the pulse laser beam capable of passing through the semiconductor wafer 10 is applied from the condenser 224. When the application position of the condenser 224 of the laser beam application means 22 reaches the other end of the dividing line 101 as shown in FIG. 5(b), the application of the pulse laser beam is suspended and the movement of the chuck table 21, that is, the semiconductor wafer 10 is stopped. In this laser processing step, the focusing point P of the pulse laser beam is set to a position near the front surface 10a (undersurface) of the semiconductor wafer 10. As a result, a deteriorated layer 110 is exposed to the front surface 10a (undersurface) and is formed from the front surface 10a toward the inside. This deteriorated layer 110 is formed as a molten-resolidified layer (that is, the deteriorated layer 110 is molten when the pulse laser beam is converged and then, solidified after the convergence of the pulse laser beam.).

The processing conditions in the above laser processing step are set as follows, for example.
Light source: LD excited Q switch Nd:YVO4 laser
Wavelength: pulse laser beam having a wavelength of 1,064 nm
Pulse output: 10 μJ
Focusing spot diameter: 1 μm
Repetition frequency: 100 kHz
Processing-feed rate: 100 mm/sec The above deteriorated layer 110 may be formed only in the inside of the wafer without being exposed to the front surface 10a and the back surface 10b. Further, a plurality of deteriorated layers 110 may be formed by carrying out the above laser processing step a plurality of times by changing the above focusing spot P stepwise.

Another embodiment of the laser processing step for reducing the strength along the dividing lines 101 of the semiconductor wafer 10 will be described with reference to FIGS. 6(a) and 6(b) and FIG. 7.

Figure 6:
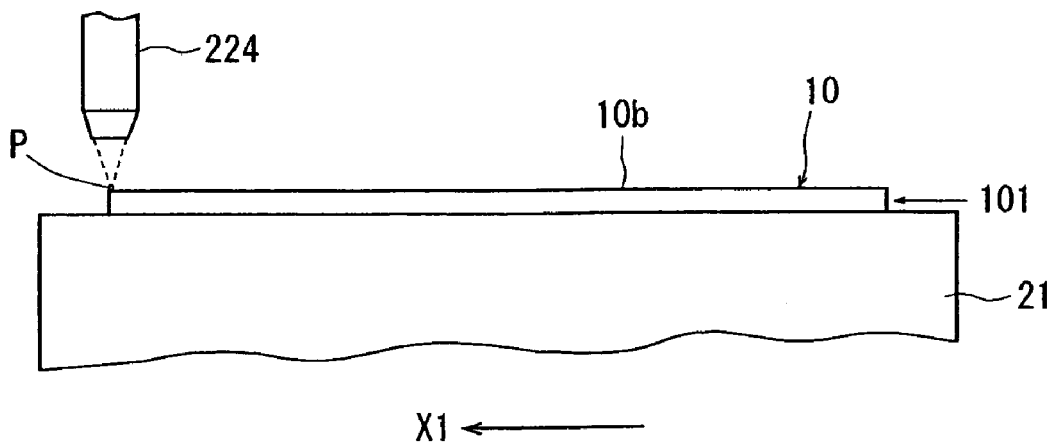
FIGS. 6(a) and 6(b) are diagrams showing another embodiment of the laser processing step in the wafer dividing method of the present invention.
Figure 7:
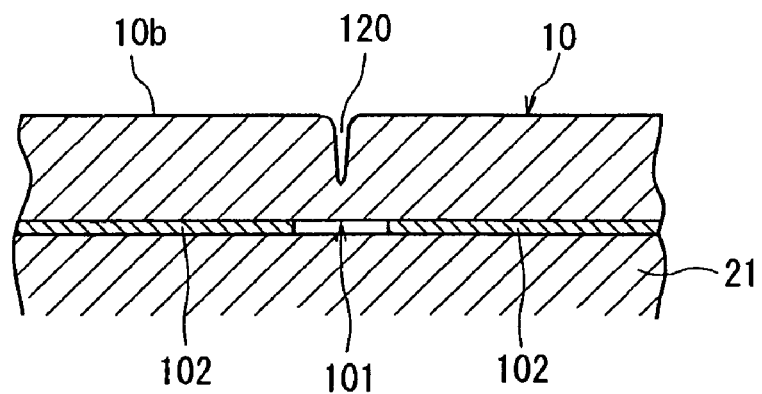
FIG. 7 is an enlarged sectional view of a semiconductor wafer having a groove formed by carrying out the laser processing step shown in FIGS. 6(a) and 6(b)

In the laser processing step shown in FIGS. 6(a) and 6(b) and FIG. 7, the strength of the semiconductor wafer 10 is reduced along the dividing lines 101 by applying a pulse laser beam having absorbency for the semiconductor wafer 10 to form a groove along the dividing lines 101 of the semiconductor wafer 10. That is, the chuck table 21 suction-holding the semiconductor wafer 10 in such a manner that the back surface 10b faces up is moved to the laser beam application area where the condenser 224 of the laser beam application means 22 for applying a laser beam is located as shown in FIG. 6(a) to bring one end (left end in FIG. 6(a)) of a predetermined dividing line 101 to a position right below the condenser 224 of the laser beam application means 22. The chuck table 21, that is, the semiconductor wafer 10 is then moved in the direction indicated by the arrow X1 in FIG. 6(a) at a predetermined processing-feed rate while the pulse laser beam having absorbency for the semiconductor wafer 10 is applied from the condenser 224 to the semiconductor wafer 10. When the application position of the condenser 224 of the laser beam application means 22 reaches the other end of the dividing line 101 as shown in FIG. 6(b), the application of the pulse laser beam is suspended and the movement of the chuck table 21, that is, the semiconductor wafer 10 is stopped. In this laser processing step, the focusing point P of the pulse laser beam is set to a position near the back surface 10b (top surface) of the semiconductor wafer 10. As a result, a groove 120 having a predetermined depth from the back surface 10b (top surface) is formed along the dividing line 101.

Figure 8:
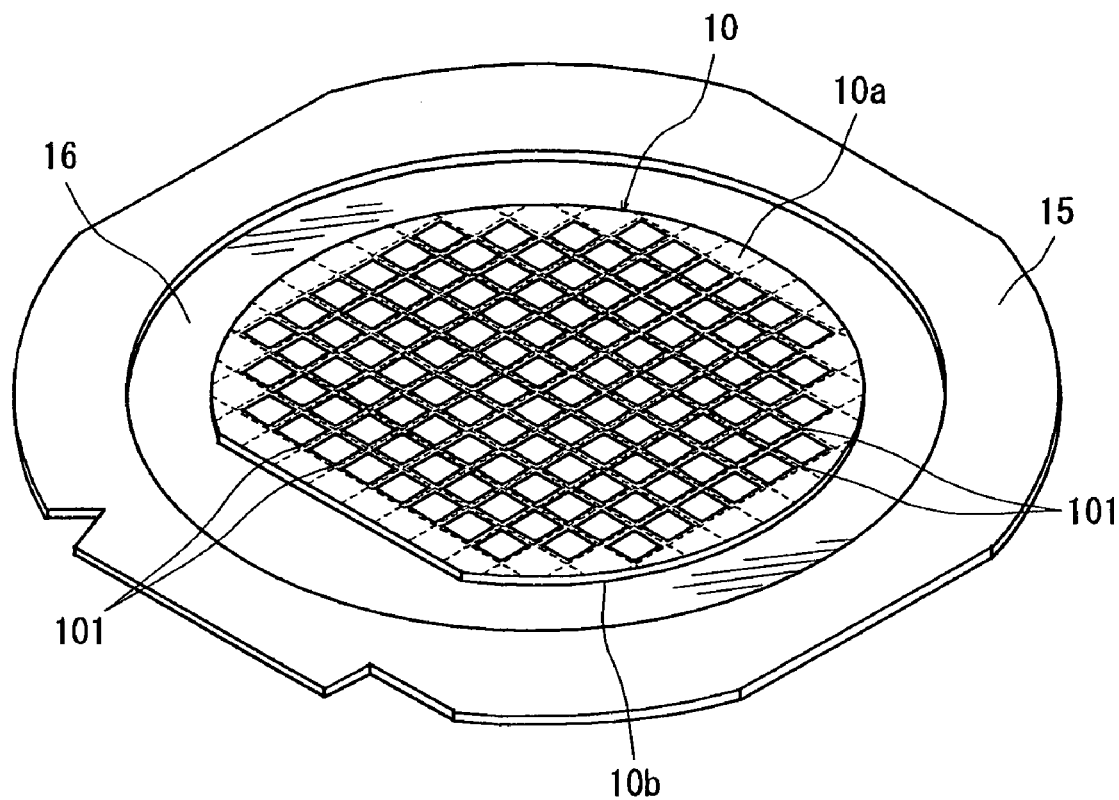
FIG. 8 is a perspective view of the semiconductor wafer which has been subjected to the laser processing step and is put on the surface of a protective tape mounted on an annular frame.

The processing conditions in the above laser processing step are set as follows, for example.
Light source: LD excited Q switch Nd:YVO4 laser
Wavelength: pulse laser beam having a wavelength of 355 nm
Pulse output: 14 μJ
Focusing spot diameter: 13 μm
Repetition frequency: 100 kHz
Processing-feed rate: 100 mm/sec After the deteriorated layer 110 or the groove 120 is formed along all the dividing lines 101 of the semiconductor wafer 10 in the above-described laser processing step, next comes a step of putting one side of the wafer on the surface of a protective tape mounted on an annular frame. That is, as shown in FIG. 8, the back surface 10b of the semiconductor wafer 10 is put on the surface of the protective tape 16 whose peripheral portion is mounted on the annular frame 15 so as to cover its inner opening. The above protective tape 16 is prepared by applying acrylic resin-based adhesive onto the surface of a 70 μm-thick sheet backing made of polyvinyl chloride (PVC) to a thickness of about 5 μm in the illustrated embodiment. This tape affixing step may be carried out before the above laser processing step. That is, the front surface 10a of the semiconductor wafer 10 is put on the protective tape 16 in such a manner that the back surface 10b faces up and the above laser processing step is carried out in a state where the semiconductor wafer 10 is supported to the annular frame 15.

The breaking step for dividing the semiconductor wafer 10 along the dividing lines 101 where the above deteriorated layer 110 or the groove 120 has been formed to reduce strength comes after the above tape affixing step. This breaking step is carried out by using a wafer dividing apparatus 3 shown in FIGS. 9 to 12.

Figure 9:
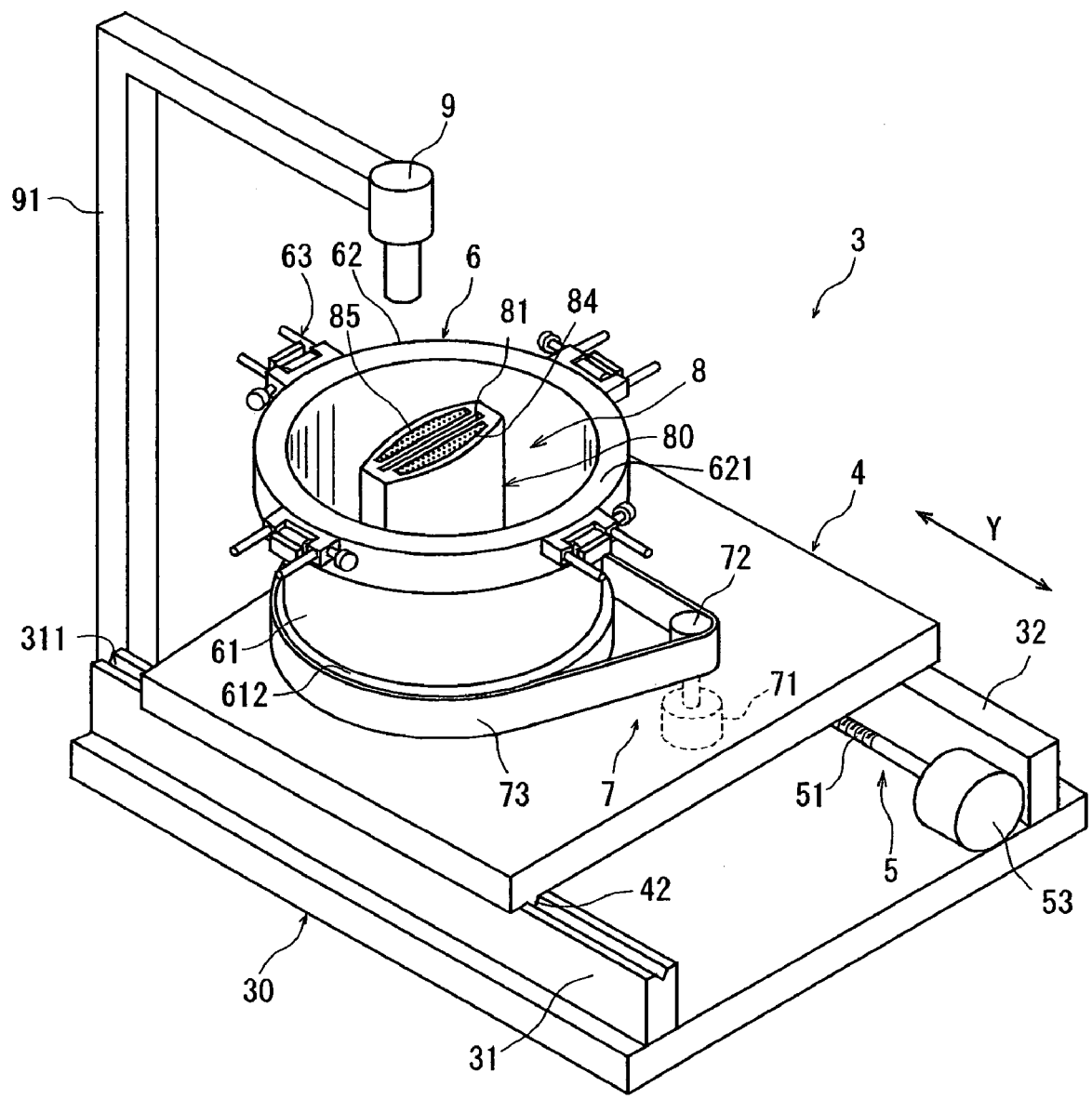
FIG. 9 is a perspective view of a wafer dividing apparatus for carrying out the dividing step in the wafer dividing method of the present invention.
Figure 10:
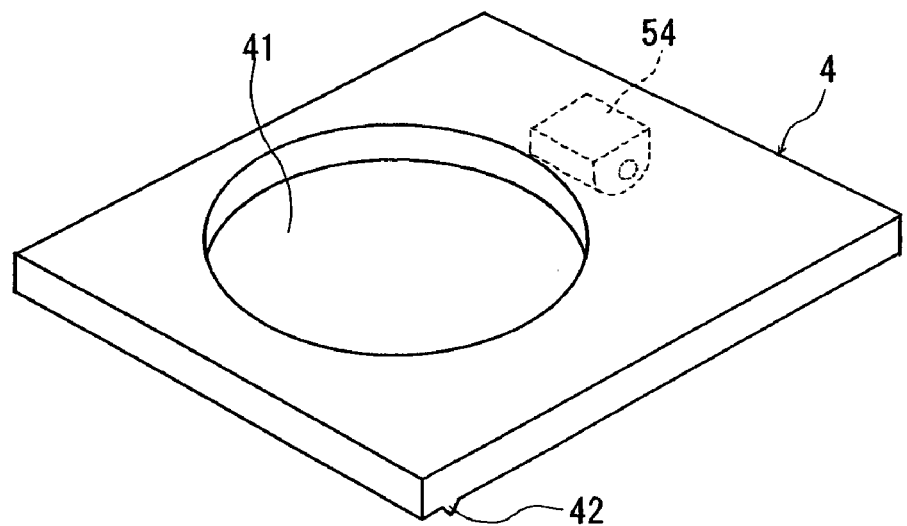
FIG. 10 is an exploded perspective view of the principal section of the dividing apparatus shown in FIG. 9.
Figure 10:
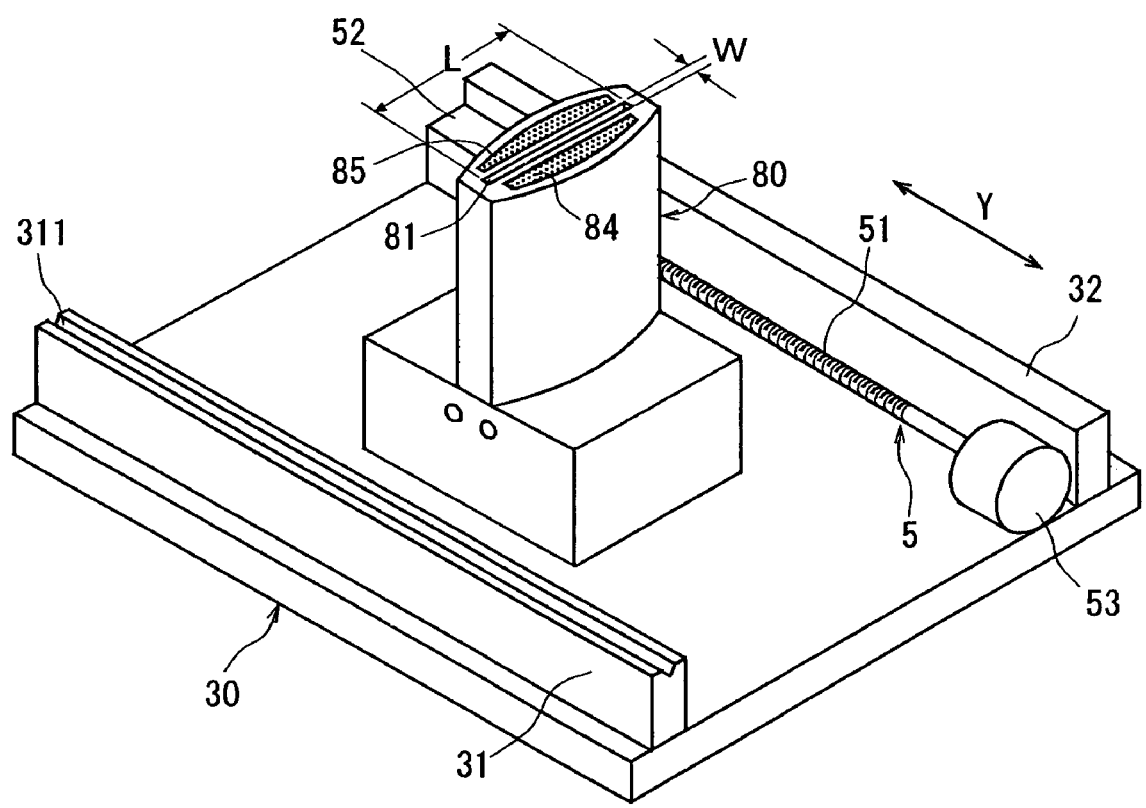

FIG. 9 is a perspective view of the wafer dividing apparatus 3, and FIG. 10 is an exploded perspective view of the principal section of the dividing apparatus 3 shown in FIG. 9. The wafer dividing apparatus 3 in the illustrated embodiment comprises a base 30 and a movable table 4 which is mounted on the base 30 in such a manner that it can move in the direction indicated by the arrow Y. The base 30 is rectangular and provided with two guide rails 31 and 32, which are installed at the both side portions on the upper surface of the base 30 and parallel to each other in the direction indicated by the arrow Y. A guide groove 311 having a V-shaped section is formed in the top surface of the guide rail 31.

The above movable table 4 is rectangular and has a circular hole 41 at the center, as shown in FIG. 10. A to-be-guided rail 42 to be slidably fitted into the guide groove 311 formed in the guide rail 31 on the base 30 is formed on the under surface of one side portion of the movable table 4. In the thus constituted movable table 4, the to-be-guided rail 42 is engaged with the guide groove 311 formed in the guide rail 31 on the base 30 and the undersurface of the other side portion is placed on the other guide rail 32 disposed on the base 30, as shown in FIG. 9.

The wafer dividing apparatus 3 in the illustrated embodiment comprises a positioning means 5 for moving the movable table 4 in the indexing-feed direction indicated by the arrow Y along the guide rails 31 and 32 provided on the base 30. This positioning means 5 comprises a male screw rod 51 arranged parallel to the guide rail 32 provided on the base 30, a bearing 52 that is disposed on the base 30 and rotatably supports one end of the male screw rod 51, a pulse motor 53 that is connected to the other end of the male screw rod 51 and rotatively drives the male screw rod 51, and a female screw block 54 that is provided on the undersurface of the above movable table 4 and is screwed into the male screw rod 51. The thus constituted positioning means 5 moves the movable table 4 in the indexing-feed direction indicated by the arrow Y by driving the pulse motor 53 in one direction or opposite direction to turn the male screw rod 51 in one direction or opposite direction.

Figure 11:
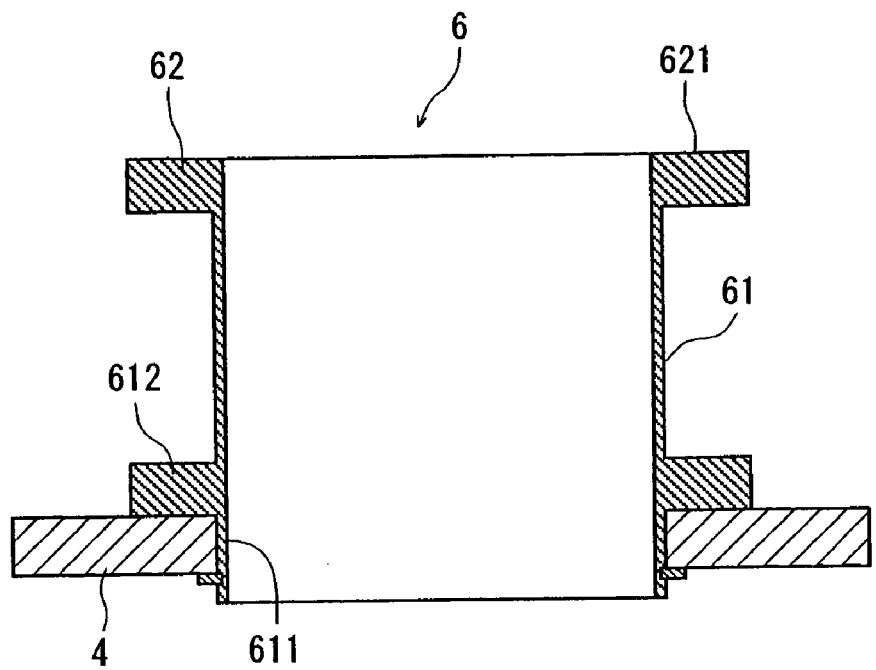
FIG. 11 is a sectional view of a movable table and a frame holding means constituting the dividing apparatus shown in FIG. 9.

The wafer dividing apparatus 3 in the illustrated embodiment comprises a frame holding means 6 for holding the annular frame 15 shown in FIG. 8. As shown in FIG. 9 and FIG. 11, the frame holding means 6 comprises a cylindrical body 61, an annular frame holding member 62 provided on the upper end of the body 61, and a plurality of clamps 63 as fixing means arranged around the frame holding member 62. The cylindrical body 61 has, at the lower end, a mounting portion 611 to be turnably fitted to the inner wall of the hole 41 formed in the above movable table 4 and an annular support flange 612 projecting in a radial direction from the outer wall above the mounting portion 611. The annular frame holding member 62 is provided on the upper end of the thus constituted cylindrical body 61. The top surface of the frame holding member 62 forms a placing surface 621 for placing the annular frame 15, and the annular frame 15 is placed on this placing surface 621. The annular frame 15 placed on the placing surface 621 is fixed on the frame holding member 62 by the clamps 63. Therefore, the frame holding means 6 functions as a tape holding means for holding the protective tape 16 affixed to the above semiconductor wafer 10 through the annular frame 15.

The wafer dividing apparatus 3 in the illustrated embodiment comprises a turning means 7 for turning the above frame holding means 6 as shown in FIG. 9. This turning means 7 comprises a pulse motor 71 mounted on the above movable table 4, a pulley 72 connected to the rotary shaft of the pulse motor 71, and an endless belt 73 wound around the pulley 72 and the support flange 612 of the cylindrical body 61. The thus constituted turning means 7 turns the frame holding means 6 through the pulley 72 and the endless belt 73 by driving the pulse motor 71.

Figure 12:
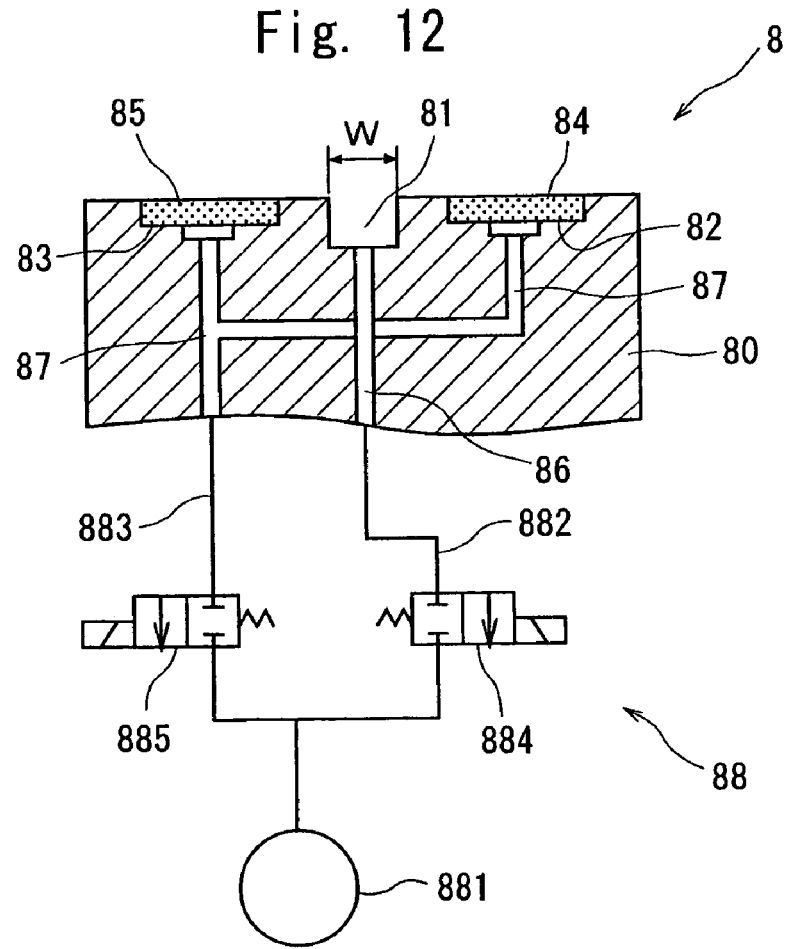
FIG. 12 is a sectional view of the wafer holding member of the suction-force providing means constituting the dividing apparatus shown in FIG. 9.

The wafer dividing apparatus 3 in the illustrated embodiment comprises a suction-force providing means 8 for giving suction-force along the dividing lines 101 to the semiconductor wafer 10 supported to the annular frame 15 held on the above annular frame holding member 62 through the protective tape 16. The suction-force providing means 8 is mounted on the above movable table 4 and arranged within the cylindrical body 61. This suction-force providing means 8 has a wafer holding member 80. A suction groove 81 that has a rectangular section extending in a direction perpendicular to the indexing-feed direction indicated by the arrow Y in FIG. 9 and FIG. 10 is formed in the top surface of this wafer holding member 80. The suction groove 81 has a length L larger than the diameter of the above semiconductor wafer 10 and a width W of about 3 to 5 mm. Fitting recesses 82 and 83 are formed on both sides of the suction groove 81 in the wafer holding member 80 in the illustrated embodiment, as shown in FIG. 12, and porous members 84 and 85 are fitted in the fitting recesses 82 and 83, respectively. The top surface of the wafer holding member 80 including the porous members 84 and 85 serves as a holding member for holding the semiconductor wafer 10 supported to the annular frame 15 held on the above annular frame holding member 62 through the protective tape 16. Suction passages 86 and 87, which communicate with the above suction groove 81 and the fitting recesses 82 and 83 and are connected to a suction means 88 are formed in the wafer holding member 80. The suction means 88 comprises a suction source 881, suction pipes 882 and 883 for connecting the suction source 881 to the above suction passages 86 and 87, and electromagnetic switching valves 884 and 885 provided in the suction pipes 882 and 883, respectively. The electromagnetic switching valves 884 and 885 cut off communication in the suction pipes 882 and 883 when they are turned off and permit communication in the suction pipes 882 and 883 when they are turned on. Therefore, when the electromagnetic switching valve 884 is turned on, negative pressure acts on the suction groove 81 from the suction source 881 through the suction pipe 882 and the suction passage 86. When the electromagnetic switching valve 885 is turned on, negative pressure acts on the fitting recesses 82 and 83 from the suction source 881 through the suction pipe 883 and the suction passage 87.

Returning to FIG. 9, the wafer dividing apparatus 3 in the illustrated embodiment comprises a detecting means 9 for detecting the dividing lines 101 of the semiconductor wafer 10 supported to the annular frame 15 shown in FIG. 8, held on the above annular frame holding member 62 through the protective tape 16. The detecting means 9 is attached to an L-shaped support pillar installed on the base 30. This detecting means 9 is composed of an optical system and an image pick-up device (CCD), and positioned above the above suction-force providing means 8. The thus constituted detecting means 9 picks up an image of a dividing line 101 of the semiconductor wafer 10 supported to the annular frame 15 held on the above annular frame holding member 62 through the protective tape 16, converts the image signal into an electrical signal and sends it to the control means that is not shown.

The wafer dividing apparatus 3 in the illustrated embodiment is constituted as described above, and its operation will be described hereinbelow with reference mainly to FIG. 9, FIG. 13 and FIGS. 14(a) and 14(b).

Figure 13:
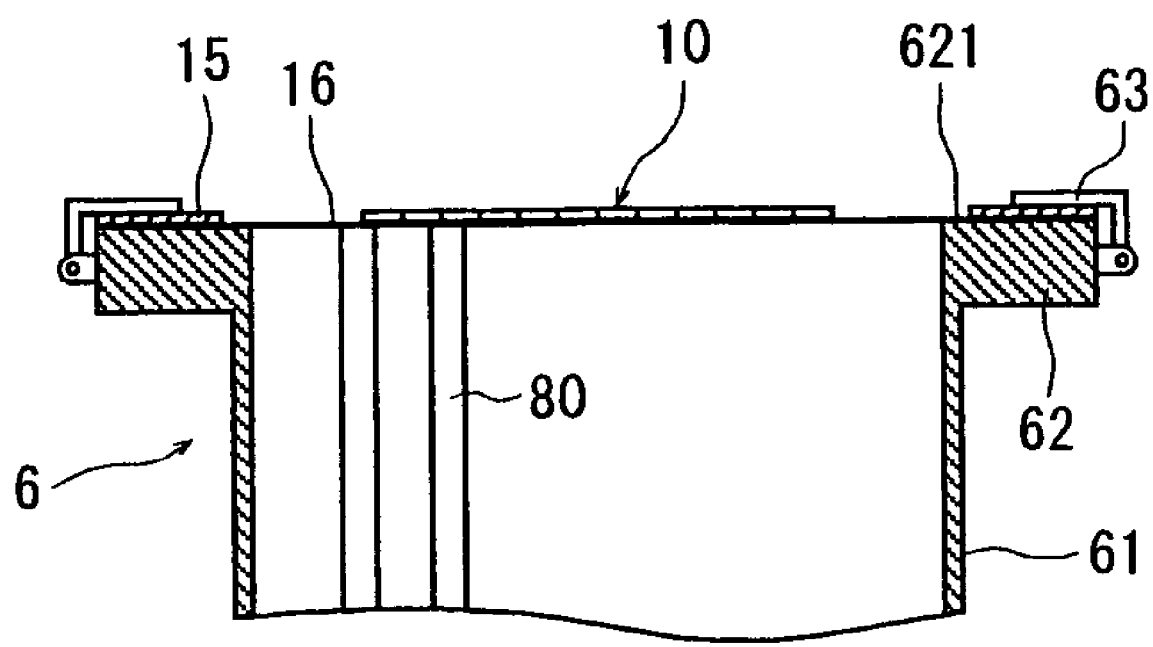
FIG. 13 is a sectional view of the principal section showing a state where the annular frame supporting the semiconductor wafer through the protective tape is held on the frame holding means constituting the dividing apparatus shown in FIG. 8.

The annular frame 15 supporting the semiconductor wafer 10 whose strength has been reduced along the dividing lines 101, through the protective tape 16 as shown in FIG. 8 is placed on the placing surface 621 of the frame holding member 62 constituting the frame holding means 6 as shown in FIG. 13 and fixed on the frame holding member 62 by the clamps 63.

Figure 14:
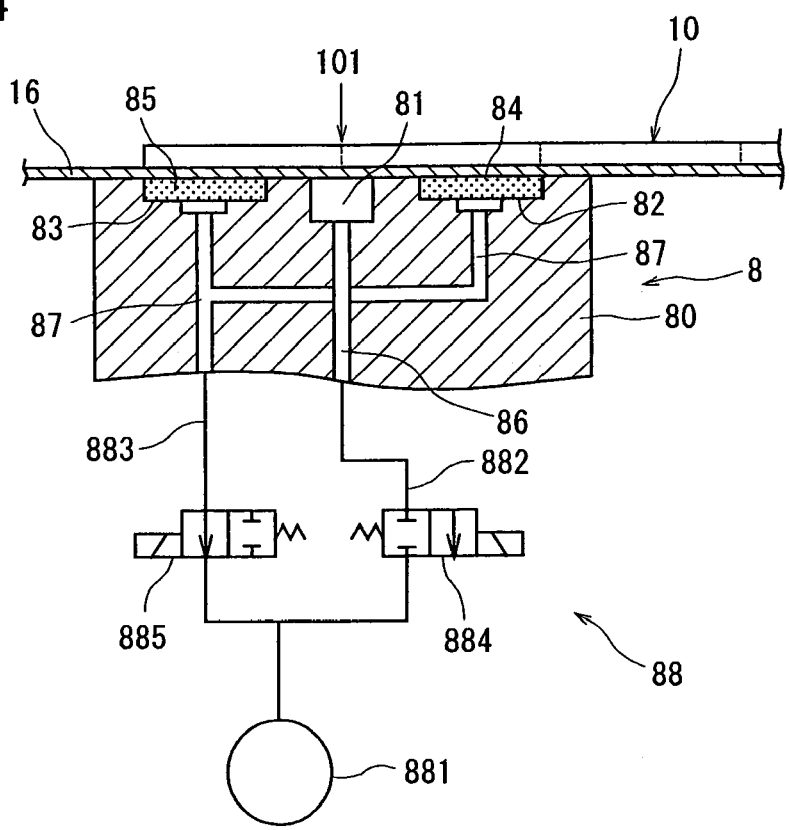
FIGS. 14(a) and 14(b) are diagrams showing the wafer holding step and the breaking step in the wafer dividing method of the present invention.
Figure 14:
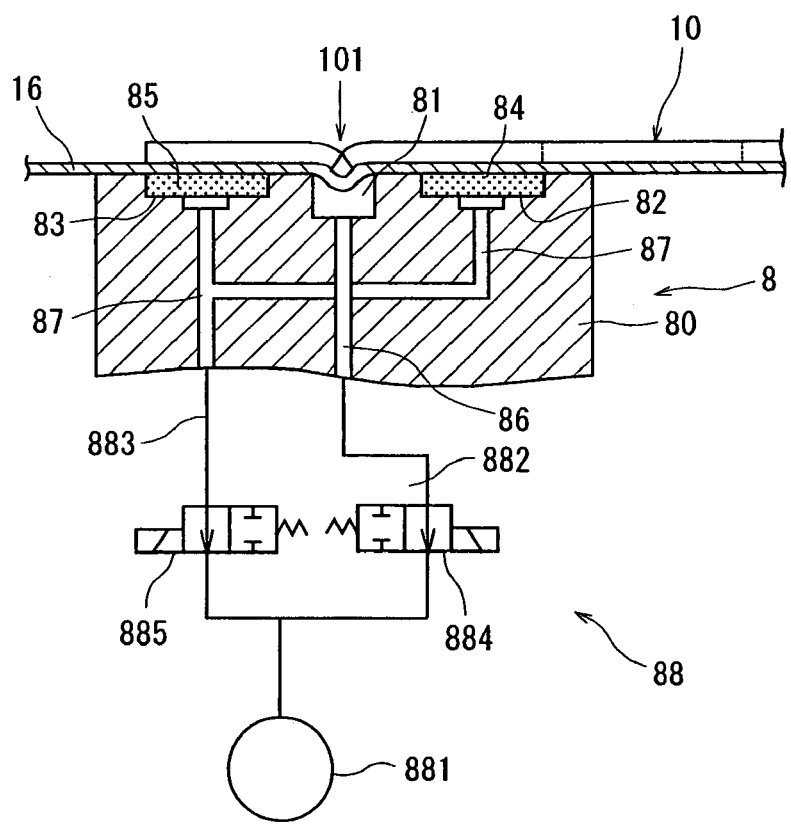

After the annular frame 15 supporting the semiconductor wafer 10 through the protective tape 16 is held on the frame holding member 62, the positioning means 5 is activated to move the movable table 4 in the direction (see FIG. 9) indicated by the arrow Y to bring one dividing line 101 (the most left dividing line in the illustrated embodiment) formed in the predetermined direction of the semiconductor wafer 10 to a position at the center in the transverse direction (right-and-left direction in FIG. 14(a)) of the suction groove 81 formed in the wafer holding member 80 as shown in FIG. 14(a). At this point, an image of the dividing line 101 is taken by the detecting means 9 to perform alignment with the suction groove 81.

After the dividing line 101 is thus positioned at the center in the transverse direction of the suction groove 81 provided in the wafer holding member 80, the electromagnetic switching valve 885 of the suction-force providing means 8 is turned on. As a result, negative pressure acts on the fitting recesses 82 and 83 from the suction source 881 through the suction pipe 883 and the suction passage 87 and further on the protective tape 16 affixed to the semiconductor wafer 10 through the porous members 84 and 85, whereby the areas on both sides of the above dividing line 101 of the semiconductor wafer 10 are suction-held on the top surface of the wafer holding member 80 through the protective tape 16 (wafer holding step).

Then, the electromagnetic switching valve 884 is turned on to allow negative pressure to act on the suction groove 81 from the suction source 881 through the suction pipe 882 and the suction passage 86. As a result, as shown in FIG. 14(b), the semiconductor wafer 10 is sucked through the protective tape 16 that is in contact with the suction groove 81. Therefore, bending stress is produced along the dividing line 101 whose strength has been reduced on the semiconductor wafer 10, whereby the semiconductor wafer 10 is broken along the dividing line 101 whose strength has been reduced (breaking step).

After the breaking step of dividing along the dividing line 101 formed in the predetermined direction as described above, the above electromagnetic switching valve 884 is turned off and the electromagnetic switching valve 885 is also turned off. As a result, the suction-holding of the semiconductor wafer 10 by the wafer holding member 80 is canceled. Thereafter, the positioning means 5 is activated to move the movable table 4 in the direction indicated by the arrow Y (see FIG. 9) by a distance corresponding to the interval between the dividing lines 101 to bring a dividing line 101 next to the dividing line 101 which has been subjected to the above breaking step, to a position at the center in the transverse direction of the suction groove 81 formed in the wafer holding member 80. Then, the above wafer holding step and the breaking step are carried out.

After the above wafer holding step and the breaking step are carried out on all the dividing lines 101 formed in the predetermined direction, the turning means 7 is activated to turn the frame holding means 6 at 90°. As a result, the semiconductor wafer 10 held on the frame holding member 62 of the frame holding means 6 is also turned at 90° so that dividing lines 101 formed in a direction perpendicular to the dividing lines 101 which have been formed in the predetermined direction and subjected to the above breaking step is positioned in a state of being parallel to the longitudinal direction of the wafer holding member 80. Subsequently, the above wafer holding step and the breaking step are carried out on all the dividing lines 101 formed in the direction perpendicular to the dividing lines 101 which have been subjected to the above breaking step to divide the semiconductor wafer 10 into individual semiconductor chips along the dividing lines 101 accurately and surely.

A description is subsequently given of another embodiment of the wafer holding member 80 constituting the above suction-force providing means 8 with reference to FIGS. 15 to 17.

Figure 15:
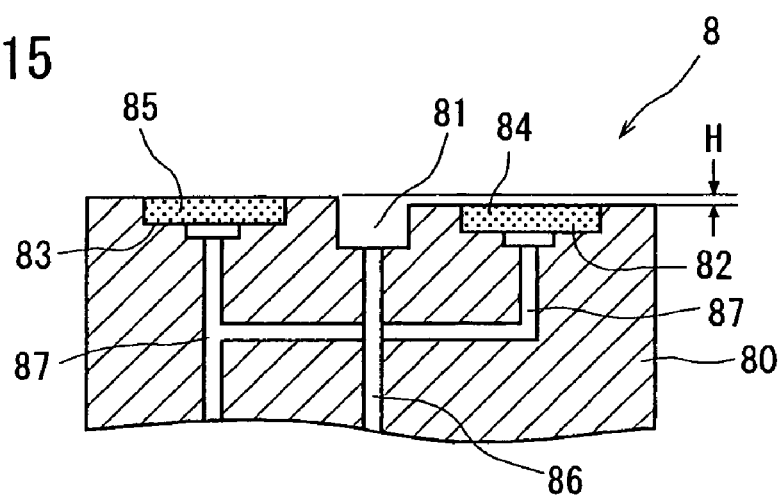
FIG. 15 is a sectional view of the principal section showing another embodiment of the wafer holding member constituting the suction-force providing means of the dividing apparatus shown in FIG. 9.

In the wafer holding member 80 shown in FIG. 15, the top surface of a holding portion for holding the porous member 85 fitted in the fitting recess 83 of the wafer holding member 80 shown in FIG. 12 is made higher than the top surface of a holding portion for holding the porous member 84 fitted in the other fitting recess 82 to form a level difference H between them. This level difference H may be about 0.1 mm. Since other constitution of the wafer holding member 80 shown in FIG. 15 is substantially the same as the wafer holding member 80 shown in FIG. 12, the same members are given the same reference symbols and their descriptions are omitted.

Figure 16:
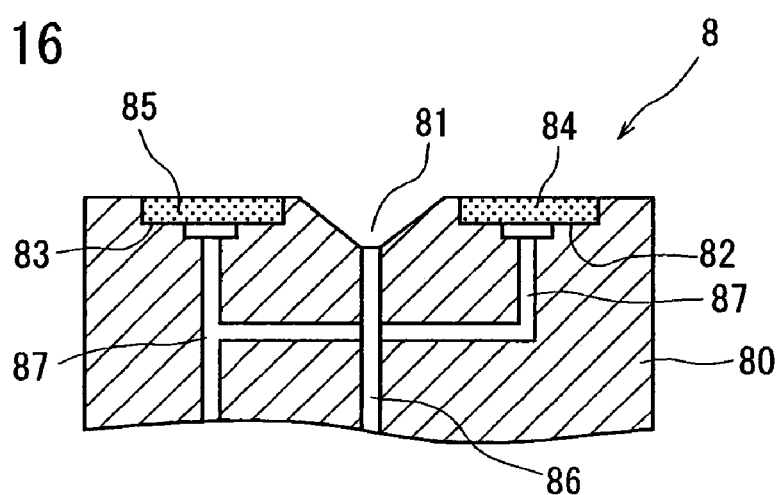
FIG. 16 is a sectional view of the principal section showing still another embodiment of the wafer holding member constituting the suction-force providing means of the dividing apparatus shown in FIG. 9.

In the wafer holding member 80 shown in FIG. 16, a suction groove 81 formed in the top surface has an inverted triangular section. Since other constitution of the wafer holding member 80 shown in FIG. 16 is substantially the same as the wafer holding member 80 shown in FIG. 12, the same members are given the same reference symbols and their descriptions are omitted.

Figure 17:
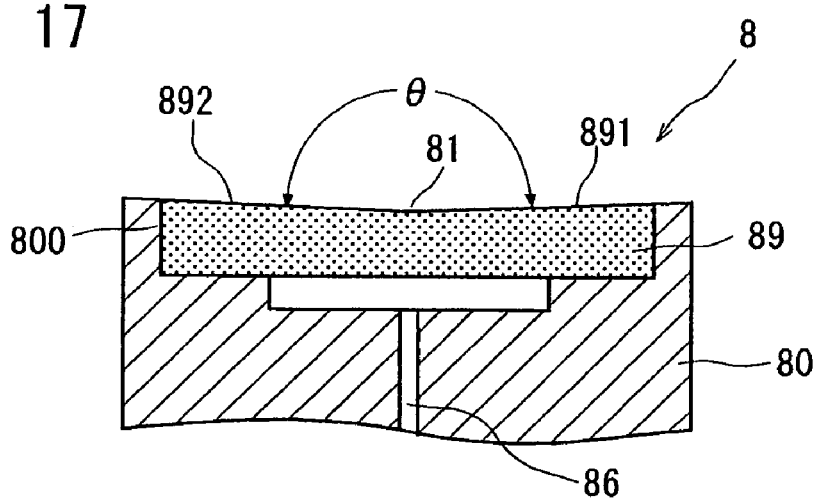
FIG. 17 is a sectional view of the principal section showing a further embodiment of the wafer holding member constituting the suction-force providing means of the dividing apparatus shown in FIG. 9.

In the wafer holding member 80 shown in FIG. 17, a suction groove 81 is formed by two inclined surfaces 891 and 892, which descend toward the center from the both ends in the transverse direction (right-and-left direction in FIG. 17) of the top surface. That is, a fitting recess 800 is formed in the top surface of the wafer holding member 80 and a porous member 89 having the above inclined surfaces 891 and 892 as the top surface is fitted into the fitting recess 800. A suction passage 86 communicating with the above fitting recess 800 is formed in the wafer holding member 80. This suction passage 86 is connected to the suction source 881 through the suction pipe 882 and the electromagnetic switching valve 884 shown in FIG. 12. In the wafer holding member 80 shown in FIG. 17, the both end portions are holding portions for holding the semiconductor wafer 10 supported to the annular frame 15 held on the above annular frame holding member 62 through the protective tape 16. The suitable angle θ formed between the inclined surfaces 891 and 892 forming the suction groove 81 of the wafer holding member 80 is about 178°.

Figure 18:
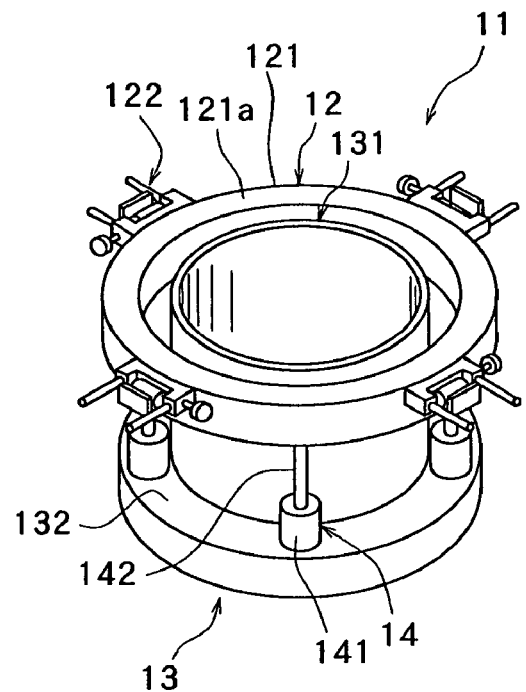
FIG. 18 is a perspective view of a tape expanding apparatus for carrying out the protective tape expanding step in the wafer dividing method of the present invention.

When a thin film such as a test metal pattern called "test element group (Teg)" is formed along the dividing lines 101 of the semiconductor wafer 10, this thin film may not be broken in some cases even by carrying out the above breaking step. Therefore, in such a case where a thin film such as a metal pattern is formed along the dividing lines 101 of the semiconductor wafer 10, a step of expanding the above protective tape 16 so as to break and divide the thin film formed on the dividing lines of the wafer is carried out. This protective tape expanding step is carried out by using a tape expanding apparatus 11 shown in FIG. 18, for example. The tape expanding apparatus 11 shown in FIG. 18 has a frame holding means 12 for holding the above annular frame 15 and a tape expansion means 13 for expanding the protective tape 16 mounted on the annular frame 15 held on the frame holding means 12. The frame holding means 12 comprises an annular frame holding member 121 and a plurality of clamps 122 as a fixing means arranged around the frame holding member 121. The top surface of the frame holding member 121 forms a placing surface 121a for placing the annular frame 15, and the annular frame 15 is placed on this placing surface 121a. The annular frame 15 mounted on the placing surface 121a is fixed on the frame holding member 121 by the clamps 122. The thus constituted frame holding means 12 is supported by the tape expansion means 13 in such a manner that it can move in the vertical direction.

The tape expansion means 13 has an expansion drum 131 arranged within the above annular frame holding member 121. This expansion drum 131 has an inner diameter smaller than the inner diameter of the annular frame 15 and an outer diameter larger than the outer diameter of the semiconductor wafer 10 on the protective tape 16 mounted on the annular frame 15. The expansion drum 131 has, at its lower end, a support flange 132. The tape expansion means 13 in the illustrated embodiment comprises a support means 14 capable of moving the above annular frame holding member 121 in the vertical direction. This support means 14 comprises a plurality of air cylinders 141 installed on the above support flange 132, and their piston rods 142 are connected to the undersurface of the above annular frame holding member 121. The support means 14 comprising the plurality of air cylinders 141 moves the annular frame holding member 121 in the vertical direction between a standard position where the placing surface 121a becomes substantially the same in height as the upper end of the expansion drum 131 and an expansion position where the placing surface 121a is positioned below the upper end of the expansion drum 131 by a predetermined distance.

Figure 19:
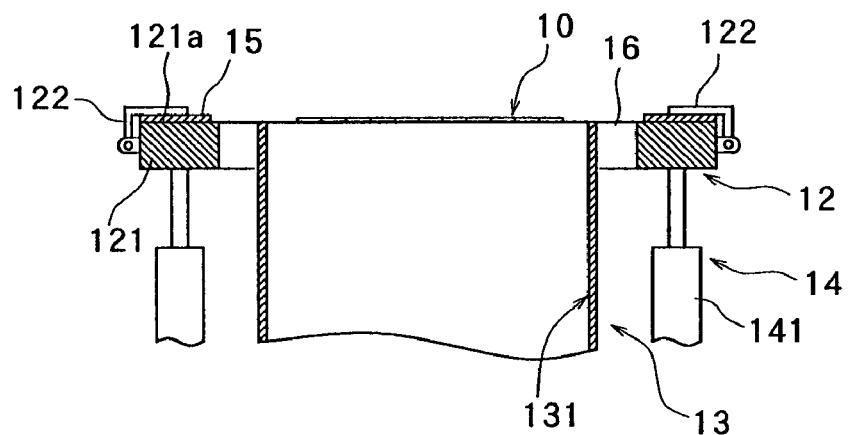
FIGS. 19(a) and 19(b) are diagrams explaining the protective tape expanding step in the wafer dividing method of the present invention.
Figure 19:
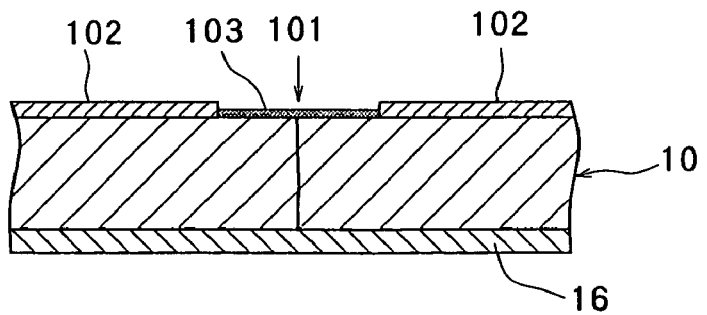

The protective tape expansion step which is carried out by using the above constituted tape expansion apparatus 11 will be described with reference to FIGS. 19(a) and 19(b). That is, the annular frame 15 supporting the semiconductor wafer 10 (that has been broken along the dividing lines 101) through the protective tape 16 is placed on the placing surface 121a of the frame holding member 121 constituting the frame holding means 12 and fixed on the frame holding member 121 by the clamps 122, as shown in FIG. 19(a). At this point, the frame holding member 121 is situated at the standard position shown in FIG. 19(a). When the annular frame 15 supporting the semiconductor wafer 10 through the protective tape 16 is held on the frame holding means 12, as shown in FIG. 19(a), a test metal pattern 103 called "test element group (Teg)" formed along the dividing lines 101 of the semiconductor wafer 10 remains unbroken as shown in FIG. 19(b).

Figure 20:
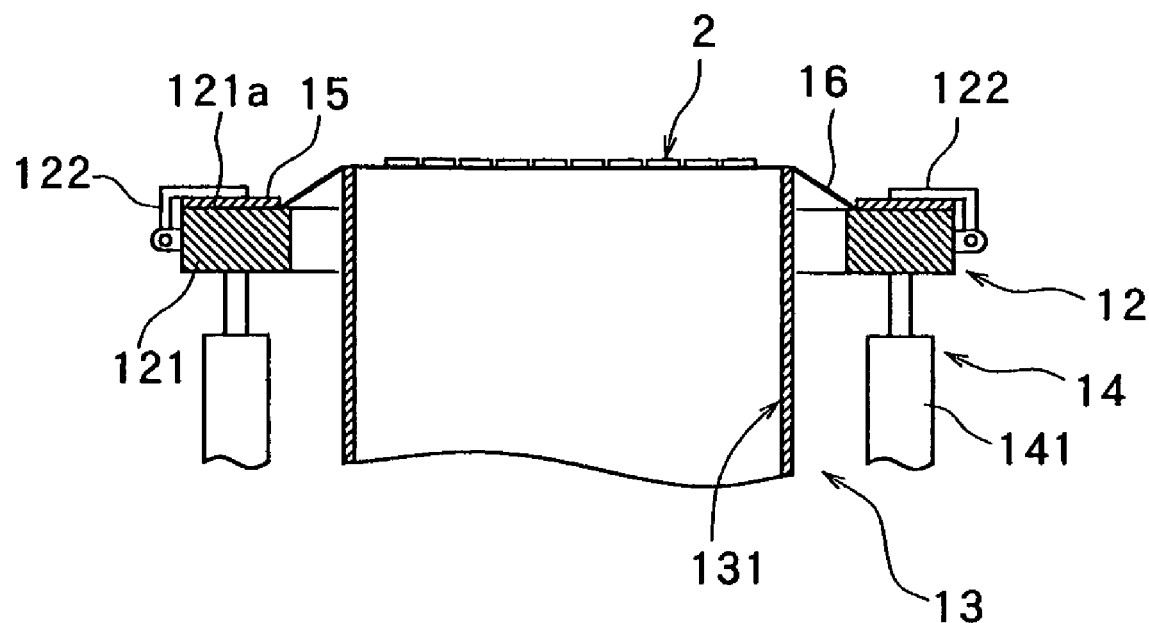
FIGS. 20(a) and 20(b) are diagrams explaining the protective tape expanding step in the wafer dividing method of the present invention.
Figure 20:
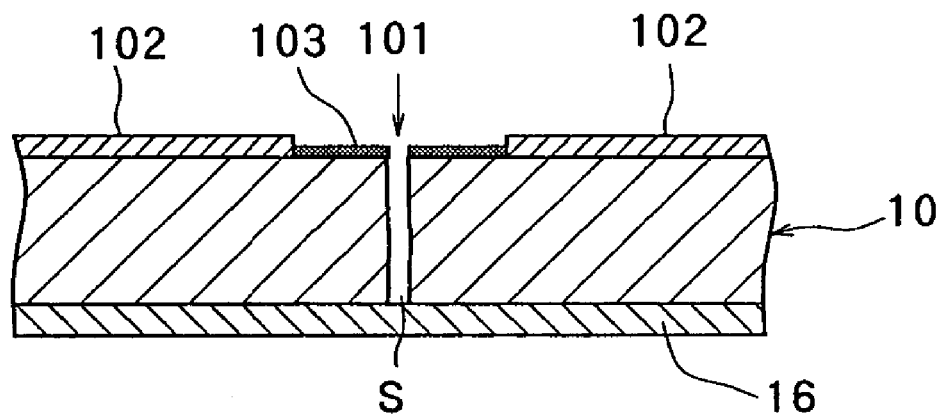

Thereafter, the annular frame holding member 121 is lowered to the expansion position shown in FIG. 20(a) by activating the plurality of air cylinders 141 as the support means 14 constituting the tape expansion means 13. Therefore, the annular frame 15 fixed on the placing surface 121a of the frame holding member 121 is also lowered, whereby the protective tape 16 mounted on the annular frame 15 comes into contact with the upper edge of the expansion drum 131 to be expanded as shown in FIG. 20(a) (protective tape expanding step). As a result, as the semiconductor wafer 10 put on the protective tape 16 has been broken along the dividing lines 101 as described above, a space S is formed along the dividing lines 101 as shown in FIG. 20(b). Consequently, tensile force acts on the test metal pattern 103 formed along the dividing lines 101 of the semiconductor wafer 10 so that the metal pattern 103 is broken along the dividing lines 101 accurately and surely.

What is claimed is:

1. A wafer dividing apparatus for dividing a wafer having a plurality of dividing lines formed in a lattice pattern on a surface thereof, said wafer being reduced in strength along the dividing lines, said apparatus comprising:
   a suction-force providing means for holding thereon a wafer having a protective tape affixed to a surface thereof, with the protective tape interposed between the suction-force providing means and the wafer, said suction-force providing means including a wafer holding member having a holding surface for holding the wafer thereon through the protective tape, said holding surface having a suction groove, along which each of the dividing lines of the wafer is to be positioned; and
   suction means for producing negative pressure within the suction groove to exert a suction force to the wafer through the protective tape along each of the dividing lines and on opposite sides of each of the dividing lines, thus breaking the wafer along each of the dividing lines; wherein
   said wafer holding member has fitting recesses on opposite sides of the suction groove, and porous members are fitted in the fitting recesses, respectively, for sealing contact with the protective tape on the wafer held on the wafer holding member; and wherein
   said suction means is communicatively connected to the suction groove and the fitting recesses through first and second switching valves, respectively.

2. The wafer dividing apparatus according to claim 1, wherein:
   one of said fitting recesses is formed in a surface which is different in level from a surface in which the other fitting groove is formed.

3. The wafer dividing apparatus according to claim 1, wherein:
   said suction groove has an inverted triangular cross section.

4. The wafer dividing apparatus according to claim 1, wherein:
   said suction groove is formed in a porous member fitted in a fitting recess formed in the holding surface of the wafer holding member, said suction groove being defined by oppositely arranged inclined surfaces descending to a center of the suction groove.

5. The wafer dividing apparatus according to claim 1, further comprising:
   a frame holding means for holding a wafer through an annular frame that supports the protective tape affixed to the wafer; and
   a positioning means for moving the frame holding means relative to said wafer holding member to align each of the dividing lines on the wafer to the suction groove.

6. The wafer dividing apparatus according to claim 5, wherein:
   said positioning means includes a table movable linearly relative to the wafer holding member and supporting the frame holding means thereon, and a turning means for turning the frame holding means relative to the table.

* * * * *